US008513689B2

(12) United States Patent  
Lee et al.

(10) Patent No.: US 8,513,689 B2
(45) Date of Patent: Aug. 20, 2013

(54) ORGANIC LIGHT EMITTING DIODE LIGHTING APPARATUS

(75) Inventors: Min-Woo Lee, Yongin (KR); Ok-Keun Song, Yongin (KR); Young-Mo Koo, Yongin (KR); Jae-Goo Lee, Yongin (KR); Sung-Jin Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 300 days.

(21) Appl. No.: 12/885,374

(22) Filed: Sep. 17, 2010

(65) Prior Publication Data

US 2011/0127556 A1 Jun. 2, 2011

(30) Foreign Application Priority Data

Nov. 27, 2009 (KR) ........................ 10-2009-0116069

(51) Int. Cl.
*H01L 33/00* (2010.01)
(52) U.S. Cl.
USPC ........................ 257/98; 257/99; 257/E33.061
(58) Field of Classification Search
USPC ................... 257/98–100, 40, E33.061, 88
See application file for complete search history.

(56) References Cited

U.S. PATENT DOCUMENTS

2002/0140646 A1* 10/2002 Sato et al. ........................ 345/82

FOREIGN PATENT DOCUMENTS

| JP | 11-273855 A | 10/1999 |
| JP | 2004-311415 | 11/2004 |
| JP | 2007-200645 | 8/2007 |
| KR | 100886902 B1 | 2/2009 |
| KR | 1020090079338 | 7/2009 |

* cited by examiner

*Primary Examiner* — Chuong A Luu
*Assistant Examiner* — Nga Doan
(74) *Attorney, Agent, or Firm* — Knobbe Martens Olson & Bear LLP

(57) ABSTRACT

An organic light emitting diode lighting apparatus includes: a substrate main body including a sealing area and a sealing line surrounding the sealing area; a plurality of first line electrodes of which both ends are located within the sealing area; a plurality of second line electrodes, at least one end of which is located outside the sealing area; an encapsulating member disposed to face the substrate main body; a sealant disposed on the sealing line to bond the substrate main body and the encapsulating member and seal the sealing area; a first connection member coupled to the ends of the plurality of first line electrodes within the sealing area; and a second connection member coupled to the ends of the plurality of second line electrodes outside the sealing area.

20 Claims, 4 Drawing Sheets

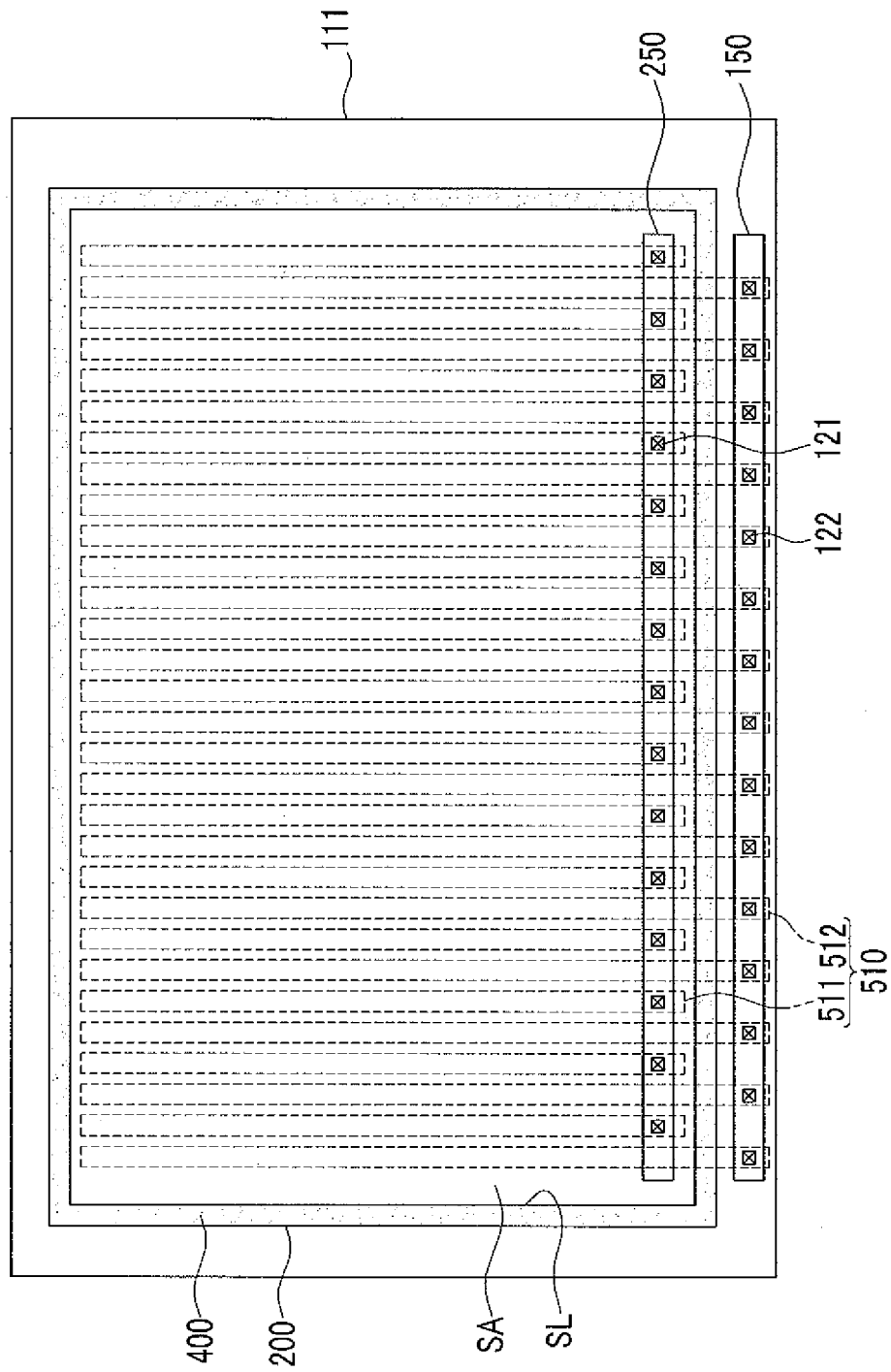

ORGANIC LIGHT EMITTING DIODE LIGHTING APPARATUS

CROSS-REFERENCE TO RELATED APPLICATIONS

This application claims priority to and the benefit of Korean Patent Application No. 10-2009-0116069 filed in the Korean Intellectual Property Office on Nov. 27, 2009, the entire contents of which are incorporated herein by reference.

BACKGROUND OF THE INVENTION

1. Field of the Invention

The described technology relates to a lighting apparatus. In some embodiments, the described technology relates to an organic light emitting diode lighting apparatus that uses an organic light emitting diode.

2. Description of the Related Art

An organic light emitting diode (OLED) has a hole injection electrode, an organic emission layer, and an electron injection electrode. The OLED emits light using energy generated when excitons produced by electron-hole combinations in the organic emission layer drop from an excited state to a ground state.

An organic light emitting diode lighting apparatus is a lighting apparatus using an organic light emitting diode. The organic light emitting diode lighting apparatus can be readily used as a surface light source. Thus, the organic light emitting diode lighting apparatus is used for various purposes while retaining the advantages of the surface light source, and the range of applications thereof is gradually expanding.

In the case of an organic light emitting diode lighting apparatus emitting light of one color, overall current supplied to an organic light emitting diode can be controlled through a single line. In the case of an organic light emitting diode lighting apparatus emitting light of various colors or luminance for which each portion has to be controlled, it is necessary to use multiple lines that can divide the organic light emitting diode into a number of cells and supply different power to each cell.

However, the use of multiple lines may lead to a complex structure due to space limitations, and may cause phenomena such as a voltage drop (IR drop).

Moreover, an organic light emitting diode lighting apparatus emitting white light is mainly used. Further, it is required for the organic light emitting diode lighting apparatus to have the function of variably adjusting the color temperature of white light according to the surrounding environment of a place where the organic light emitting diode lighting apparatus is used.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology solves the problems of the above-mentioned background art and provides an organic light emitting diode lighting apparatus that can effectively emit light of various colors or control luminance for each portion, and that has improved luminous efficiency.

The exemplary embodiment provides an organic light emitting diode lighting apparatus that can variably adjust the color temperature of emitted light.

Furthermore, the exemplary embodiment provides an organic light emitting diode lighting apparatus that suppresses or prevents a voltage drop.

An organic light emitting diode lighting apparatus according to an exemplary embodiment includes: a substrate main body including a sealing area and a sealing line surrounding the sealing area; a plurality of first line electrodes with both ends located within the sealing area; a plurality of second line electrodes, at least one end of each is located outside the sealing area; an encapsulating member disposed to face the substrate main body; a sealant disposed on the sealing line to bond the substrate main body and the encapsulating member and seal the sealing area; a first connection member coupled to the ends of the plurality of first line electrodes within the sealing area; and a second connection member coupled to the ends of the plurality of second line electrodes outside the sealing area.

The first connection member may be formed on one surface of the encapsulating member facing the substrate main body and coupled to the plurality of first line electrodes, and the second connection member may be formed on the substrate main body and coupled to the plurality of second line electrodes.

The plurality of first line electrodes and the plurality of second line electrodes may be formed on the same layer and may be alternately arranged.

The first connection member and the second connection member may be formed in a direction intersecting the plurality of first line electrodes and the plurality of second line electrodes.

The organic light emitting diode lighting apparatus may further include an electrode insulating layer that is formed on the ends of the plurality of first line electrodes and the ends of the plurality of second line electrodes on the edges of the substrate main body. The electrode insulating layer may have first contact holes that partially expose the ends of the plurality of first line electrodes, and second contact holes that partially expose the ends of the plurality of second line electrodes.

The first connection member may be coupled to the plurality of first line electrodes via the first contact holes, and the second connection member may be coupled to the plurality of second line electrodes via the second contact holes.

A pair of the first connection members may be respectively coupled to both ends of the first line electrodes, and a pair of the second connection members may be respectively coupled to both ends of the second line electrodes.

The organic light emitting diode lighting apparatus may further include at least one organic emission layer formed on the plurality of first line electrodes and the plurality of second line electrodes within the sealing area of the substrate main body, and a common electrode formed on the organic emission layer.

The organic emission layer may include: a first organic emission layer formed on the plurality of first line electrodes; and a second organic emission layer formed on the plurality of second line electrodes.

The first organic emission layer and the second organic emission layer may emit light of different colors from each other.

Either one of the first organic emission layer and the second organic emission layer may emit light of an orange-yellow base color having a wavelength range of 550 nm to 620 nm. The other of the first organic emission layer and the second organic emission layer may emit light of a blue base color having a wavelength range of 430 nm to 480 nm.

The first driving voltage and the second driving voltage may be supplied to the plurality of first line electrodes and the plurality of second line electrodes through the first connection member and the second connection member.

The first driving voltage and the second driving voltage may be selectively adjusted to selectively control the luminance of lights emitted from the first organic emission layer and the second organic emission layer.

The light generated from the first organic emission layer and the light generated from the second organic emission layer may be mixed to produce white light.

The first driving voltage and the second driving voltage may be adjusted to adjust the color temperature of the white light.

The encapsulating member may be a metal can.

The encapsulating member may be a glass substrate.

The encapsulating member may be a plastic substrate.

According to an exemplary embodiment, the organic light emitting diode lighting apparatus can effectively emit light of various colors or control luminance for each portion, and is improved in luminous efficiency.

Moreover, the organic light emitting diode lighting apparatus can variably adjust the color temperature of emitted light.

Furthermore, the organic light emitting diode lighting apparatus can suppress or prevent a voltage drop.

BRIEF DESCRIPTION OF THE DRAWINGS

FIG. 4 is a layout view of an organic light emitting diode lighting apparatus according to a second exemplary embodiment.

DETAILED DESCRIPTION OF THE INVENTION

Figure 1:
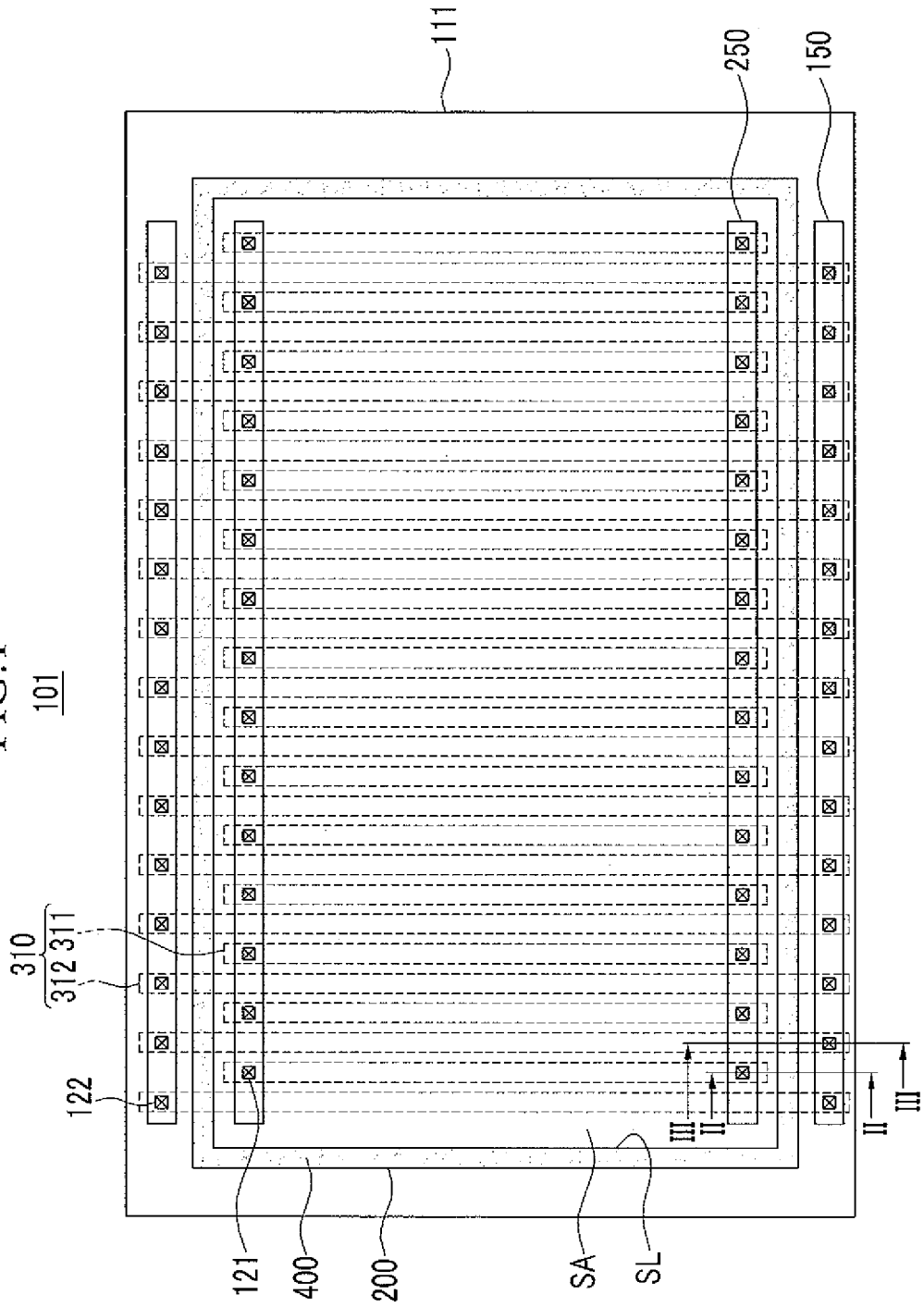
FIG. 1 is a layout view of an organic light emitting diode lighting apparatus according to a first exemplary embodiment.

Hereinafter, exemplary embodiments will be described in detail with reference to the accompanying drawings such that those skilled in the art can easily carry out the exemplary embodiments. As those skilled in the art would realize, the described embodiments may be modified in various different ways, all without departing from the spirit or scope of the present embodiments.

Also, among several exemplary embodiments, a first exemplary embodiment will be representatively described, and the other exemplary embodiments will be described with respect to the components differing from those of the first exemplary embodiment.

To clearly describe the exemplary embodiments, parts not related to the description are omitted, and like reference numerals designate like components throughout the specification.

In the drawings, the sizes and thicknesses of the components are merely shown for convenience of explanation, and therefore an exemplary embodiment is not limited to the illustrations described and shown herein.

In the drawings, the thickness of layers, films, panels, regions, etc., may be exaggerated for clarity. In the drawings, the thicknesses of some layers and areas may be exaggerated for convenience of explanation. It will be understood that when an element such as a layer, film, region, or substrate is referred to as being "on" another element, it can be directly on the other element or intervening elements may also be present.

Hereinafter, an organic light emitting diode lighting apparatus 101 according to a first exemplary embodiment will be described with reference to FIGS. 1 to 3.

Figure 2:
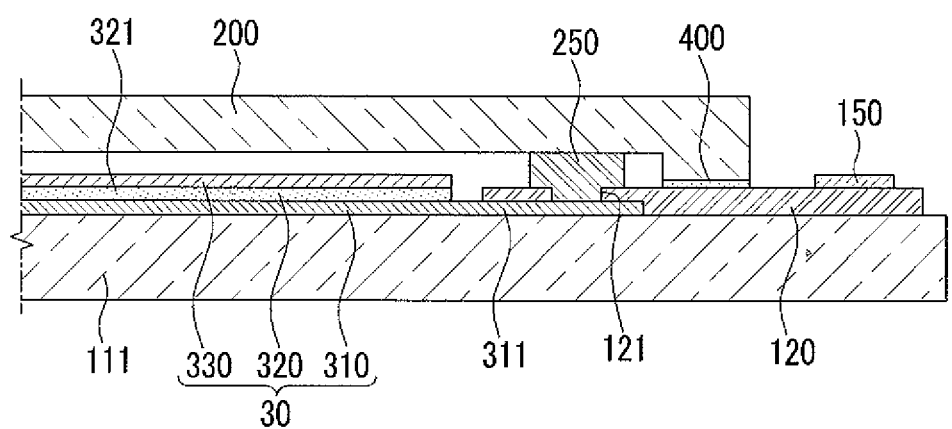
FIG. 2 is a cross-sectional view taken along line II-II of FIG. 1.
Figure 3:
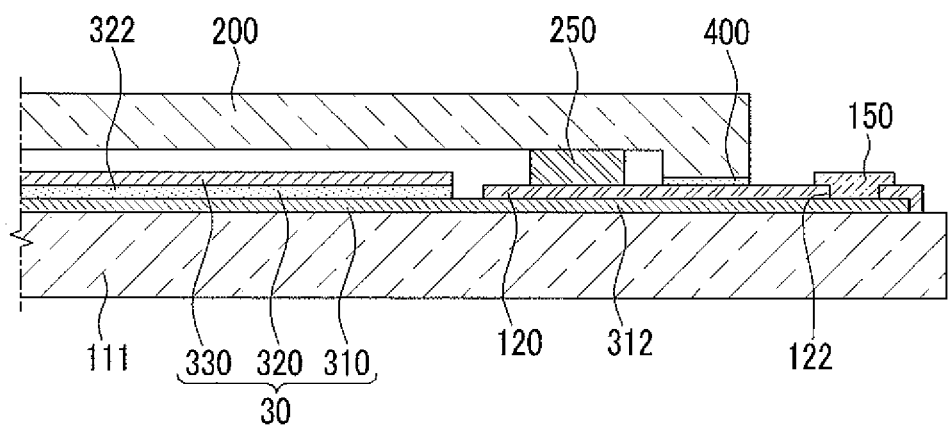
FIG. 3 is a cross-sectional view taken along line III-III of FIG. 1.

As shown in FIGS. 1 to 3, the organic light emitting diode lighting apparatus 101 according to the first exemplary embodiment includes a substrate main body 111, a line electrode 310, an organic emission layer 320, a common electrode 330, an encapsulating member 200, a sealant 400, a first connection member 250, and a second connection member 150. Here, the line electrode 310, the organic emission layer 320, and the common electrode 330 form an organic light emitting diode (OLED) 30. Though not shown, the organic light emitting diode lighting apparatus 101 may further include a flexible printed circuit board (FPCB) that is connected to the first connection member 250 and the second connection member 150 to supply a driving voltage.

The substrate main body 111 is formed of a transparent insulating material. For example, the substrate main body 111 may be an insulating substrate made of glass, quartz, ceramic, plastic, or the like. Also, as shown in FIG. 1, the substrate main body 111 includes a sealing area SA and a sealing line SL surrounding the sealing area.

The line electrode 310 is formed on the substrate main body 111. The line electrode 310 includes a plurality of first line electrodes 311 of which both ends are located within the sealing area SA of the substrate main body, and a plurality of second line electrodes 312 of which both ends are located outside the sealing area SA of the substrate main body 111. The second line electrodes 312 are relatively longer than the first line electrodes 311. Thus, the ends of the plurality of second line electrodes 312 pass through the sealing line SL of the substrate main body 111 and extend to the outside.

Moreover, the plurality of first line electrodes 311 and the plurality of second line electrodes 312 are formed substantially parallel to each other on the same layer, and are alternately arranged.

The organic emission layer 320 is formed on the line electrode 310 within the sealing area SA of the substrate main body 111. In the first exemplary embodiment, as shown in FIGS. 2 and 3, the organic emission layer 320 includes a first organic emission layer 321 formed on the plurality of first line electrodes 311 and a second organic emission layer 322 formed on the plurality of second line electrodes 312. The first organic emission layer 321 and the second organic emission layer 322 can emit light of different colors from each other. In some embodiments, either one of the first organic emission layer 321 and the second organic emission layer 322 emits light of an orange-yellow base color having a wavelength range of from about 550 nm to about 620 nm. The other of the first organic emission layer 321 and the second organic emission layer 322 can emit light of a blue base color having a wavelength range of from about 430 nm to about 480 nm. Also, the light respectively emitted from the first organic emission layer 321 and the second organic emission layer 322 can be mixed to finally produce white light. However, the first exemplary embodiment is not limited thereto. Thus, the first organic emission layer 321 and the second organic emission layer 322 may emit light of various colors that are different from each other, and the light emitted from first organic emission layer 321 and the second organic emission layer 322 and mixed together may have colors other than white.

Moreover, the organic emission layer 320 is formed of a low molecular organic material or a high molecular organic material. The organic emission layer 320 may be formed as a multiple layer including at least one of an emission layer, a hole injection layer HIL, a hole transport layer HTL, an electron transport layer ETL, and an electron injection layer EIL.

The common electrode 330 is formed on the organic emission layer 320. A Vss voltage may be applied to the common electrode 330. In the first exemplary embodiment, the line electrode 310 becomes an anode and the common electrode 330 becomes a cathode. However, the first exemplary embodiment is not limited thereto.

The line electrode 310 and the common electrode 320 can be formed of any one of a transparent conductive layer, a semi-transmissive metal layer, and a reflective metal layer. The transparent conductive layer may be made of, for example, ITO (indium tin oxide), IZO (indium zinc oxide), ZnO (zinc oxide), $In_2O_3$ (indium oxide), etc. The semi-transmissive metal layer and the reflective metal layer may be made of at least one metal of magnesium (Mg), silver (Ag), gold (Au), calcium (Ca), lithium (Li), chromium (Cr), and aluminum (Al), or an alloy thereof. Although a metal layer reflects light, the metal layer can transmit light if it is reduced in thickness to several tens of nanometers. Thus, a semi-transmissive metal layer or a reflective metal layer can be formed by adjusting the thickness of a metal layer.

The light emitting direction of the organic light emitting diode lighting apparatus 101 may vary depending on the materials of the line electrode 310 and the common electrode 330. In the first exemplary embodiment, the organic light emitting diode lighting apparatus 101 includes the line electrode 310 made of a transparent conductive layer or a semi-transmissive metal layer, and the common electrode 330 made of a reflective metal layer. The organic light emitting diode lighting apparatus 101 according to the first exemplary embodiment has a bottom-emission structure. However, the first exemplary embodiment is not limited thereto. Therefore, the organic light emitting diode lighting apparatus 101 may be formed as a front-emission structure or a dual-emission structure.

Moreover, as shown in FIGS. 2 and 3, the organic light emitting diode lighting apparatus 101 further includes an electrode insulating layer 120 formed on the ends of the line electrode 310 on the edges of the substrate main body 111. The electrode insulating layer 120 has first contact holes 121 that partially expose the ends of the plurality of first line electrodes 311, and second contact holes 122 that partially expose the ends of the plurality of second line electrodes 312. The electrode insulating layer 120 may be formed of various inorganic or organic materials known to those skilled in the art. In addition, the electrode insulating layer 120 may be formed at any location other than the edges of the substrate main body 111, as needed.

The encapsulating member 200 is disposed to face the substrate main body 111. In the first exemplary embodiment, a metal can made of a metal material is used as the encapsulating member 200. If necessary, all or part of the metal can is coated with an oxide layer or an insulating layer. However, the first exemplary embodiment is not limited thereto. Thus, like the substrate main body 111, the encapsulating member 200 may be a transparent insulating substrate. The encapsulating member 200 may also be a glass substrate or a plastic substrate.

The sealant 400 is disposed between the substrate main body 111 and the encapsulating member 200 along the sealing line SL of the substrate main body 111. The sealant 400 bonds the substrate main body 111 and the encapsulating member 200 together to seal the sealing area SA of the substrate main body 111. The sealant 400 may be formed of various materials known to those skilled in the art.

The first connection member 250 is formed on the encapsulating member 200. Specifically, the first connection member 250 is formed on one surface of the encapsulating member 200 facing the substrate main body 111. The first connection member 250 is coupled to the ends of the first line electrodes 311 within the sealing area SA of the substrate main body 111. As the encapsulating member 200 is bonded to the substrate main body 111, the first connection member 250 rimmed on the encapsulating member 200 is coupled to the first line electrodes 311. Further, the first connection member 250 is formed in a direction intersecting the first line electrodes 311, and is coupled to the first line electrodes 311 via the first contact holes 121 of the electrode insulating layer 120.

The second connection member 150 is formed on the substrate main body 111. The second connection member 150 is coupled to the ends of the plurality of second line electrodes 312 outside the sealing area SA of the substrate main body 111. The second connection member 150 is formed in a direction intersecting the second line electrodes 312, and is coupled to the second line electrodes 312 via the second contact holes 122.

The first connection member 250 and the second connection member 150 supply first and second driving voltages generated from a flexible printed circuit (not shown) to the plurality of first line electrodes 311 and the plurality of second line electrodes 312, respectively.

In this manner, the plurality of first line electrodes 311 and the plurality of second line electrodes 312 can be driven separately through the first connection member 250 and the second connection member 150, respectively. Thus, it is possible to control the luminance of lights emitted from the first organic emission layer 321 and the second emission layer 322 by selectively adjusting the first driving voltage supplied to the first line electrodes 311 and the second driving voltage supplied to the second line electrodes 312.

In the first exemplary embodiment, light of an orange-yellow base color and light of a blue base color respectively emitted from the first emission layer 321 and the second emission layer 322 are mixed to finally emit white light. The color temperature of the white light finally emitted from the organic light emitting diode lighting apparatus 101 can be adjusted by adjusting the first driving voltage and second driving voltage supplied to the first line electrodes 311 and second line electrodes 312.

Alternatively, in the first exemplary embodiment, the organic light emitting diode lighting apparatus 101 can combine the light emitted from the first organic emission layer 321 and the second organic emission layer 322 to emit light of various colors of light other than white.

The first connection member 250 and the second connection member 150 are disposed adjacent to the sealing line SL. Due to process tolerance during manufacture, a dummy space may be required around the sealing line SL. Particularly, the sealing line SL and the organic emission layer 320 formed within the sealing line SL can be spaced apart by a predetermined distance. The organic light emitting diode lighting apparatus 101 according to the first exemplary embodiment improves luminous efficiency by effectively utilizing the dummy space. That is, the line electrode 310 is divided into the first line electrodes 311 and second line electrodes 312 having different lengths from each other, and the first connection member 250 and second connection member 150, which are to be respectively coupled to the first line electrodes 311 and second line electrodes 312, are disposed separately on the inside and outside of the sealing area SA around the sealing line SL. Thus, the organic light emitting diode lighting apparatus 101 can ensure a maximum light emitting area. The non-light emitting area of the organic light emitting diode lighting apparatus 101 can be minimized.

Moreover, the first connection member 250 is formed on the encapsulating member 200, and the first connection member 250 is coupled to the plurality of first line electrodes 311 by bonding the encapsulating member 200 and the substrate main body 111, thereby simplifying the entire structure and simplifying the manufacturing process.

Further, a pair of the first connection members 250 and a pair of the second connection members 150 are coupled to both ends of the plurality of first line electrodes 311 and both ends of the plurality of second line electrodes, respectively, thereby effectively suppressing or preventing a voltage drop (IR-drop).

As discussed above, the organic light emitting diode lighting apparatus 101 according to the first exemplary embodiment can effectively emit light of various colors or control luminance for each portion, and can improve luminous efficiency.

Moreover, the organic light emitting diode lighting apparatus 101 can variably adjust the color temperature of emitted light.

Furthermore, the organic light emitting diode lighting apparatus can suppress or prevent a voltage drop.

An organic light emitting diode lighting apparatus 102 according to a second exemplary embodiment will be described with reference to FIG. 4.

As shown in FIG. 4, the organic light emitting diode lighting apparatus 102 according to the second exemplary embodiment includes one first connection member 250 and one second connection member 150. The first connection member 250 and the second connection member 150 are coupled only to one end of each of a plurality of first line electrodes 511 and one end of each of a plurality of second line electrodes 512.

With the above-described configuration, the organic light emitting diode lighting apparatus 102 according to the second exemplary embodiment can effectively emit light of various colors or control luminance for each portion, and can improve luminous efficiency. The organic light emitting diode lighting apparatus 102 can ensure a wide light emitting area.

Therefore, the organic light emitting diode lighting apparatus 102 can variably adjust the color temperature of emitted light.

While this disclosure has been described in connection with what is presently considered to be practical exemplary embodiments, it is to be understood that the embodiments are not limited to the disclosed embodiments, but, on the contrary, is intended to cover various modifications and equivalent arrangements included within the spirit and scope of the appended claims.

What is claimed is:

1. An organic light emitting diode lighting apparatus comprising:
    a substrate main body including a sealing area and a sealing line surrounding the sealing area;
    a plurality of first line electrodes of which both ends are located within the sealing area;
    a plurality of second line electrodes, at least one end of each is located outside the sealing area;
    an encapsulating member disposed to face the substrate main body;
    a sealant disposed on the sealing line configured to bond the substrate main body and the encapsulating member and seal the sealing area;
    a first connection member coupled to the ends of the plurality of first line electrodes within the sealing area; and
    a second connection member coupled to the ends of the plurality of second line electrodes outside the sealing area.

2. The apparatus of claim 1, wherein
    the first connection member is formed on one surface of the encapsulating member facing the substrate main body and coupled to the plurality of first line electrodes, and
    the second connection member is formed on the substrate main body and coupled to the plurality of second line electrodes.

3. The apparatus of claim 1, wherein the plurality of first line electrodes and the plurality of second line electrodes are formed on the same layer and are alternately arranged.

4. The apparatus of claim 1, wherein the first connection member and the second connection member are formed in a direction intersecting the plurality of first line electrodes and the plurality of second line electrodes.

5. The apparatus of claim 1, further comprising an electrode insulating layer that is formed on the ends of the plurality of first line electrodes and the ends of the plurality of second line electrodes on the edges of the substrate main body,
    wherein the electrode insulating layer has first contact holes that partially expose the ends of the plurality of first line electrodes and second contact holes that partially expose the ends of the plurality of second line electrodes.

6. The apparatus of claim 5, wherein the first connection member is coupled to the plurality of first line electrodes via the first contact holes, and the second connection member is coupled to the plurality of second line electrodes via the second contact holes.

7. The apparatus of claim 1, wherein
    a pair of the first connection members are respectively coupled to both ends of the first line electrodes, and
    a pair of the second connection members are respectively coupled to both ends of the second line electrodes.

8. The apparatus of claim 1, further comprising at least one organic emission layer formed on the plurality of first line electrodes and the plurality of second line electrodes within the sealing area of the substrate main body, and a common electrode formed on the organic emission layer.

9. The apparatus of claim 8, wherein the organic emission layer comprises a first organic emission layer formed on the plurality of first line electrodes and a second organic emission layer formed on the plurality of second line electrodes.

10. The apparatus of claim 9, wherein the first organic emission layer and the second organic emission layer emit light of different colors.

11. The apparatus of claim 10, wherein
    either one of the first organic emission layer and the second organic emission layer emits light of an orange-yellow base color having a wavelength range of from about 550 nm to about 620 nm, and
    the other one of the first organic emission layer and the second organic emission layer emits light of a blue base color having a wavelength range of from about 430 nm to about 480 nm.

12. The apparatus of claim 9, wherein a first driving voltage and a second driving voltage are supplied to the plurality of first line electrodes and the plurality of second line electrodes through the first connection member and the second connection member.

13. The apparatus of claim 12, wherein the first driving voltage and the second driving voltage are selectively adjusted to selectively control a luminance of light emitted from the first organic emission layer and the second organic emission layer.

14. The apparatus of claim 12, wherein a light generated from the first organic emission layer and a light generated from the second organic emission layer are mixed to produce white light.

15. The apparatus of claim 14, wherein the first driving voltage and the second driving voltage are adjusted to adjust a color temperature of the white light.

16. The apparatus of claim 8, wherein the encapsulating member is a metal can.

17. The apparatus of claim 8, wherein the encapsulating member is a glass substrate.

18. The apparatus of claim 8, wherein the encapsulating member is a plastic substrate.

19. The apparatus of claim 16, wherein the encapsulating member is coated with an oxide layer.

20. The apparatus of claim 16, wherein the encapsulating member is coated with an insulating layer.

* * * * *